(12) United States Patent
Lang et al.

(10) Patent No.: US 9,049,804 B2
(45) Date of Patent: Jun. 2, 2015

(54) MODULAR MONITOR ENCLOSED IN A HOUSING WITH A NOVEL REAR PANEL

(71) Applicant: Mekra Lang GmbH & Co. KG, Fuerth (DE)

(72) Inventors: Werner Lang, Ergersheim (DE); Simon Deffner, Flachslanden (DE); Jon Hohenhaus, Neustadt an der Aisch (DE); Andreas Redlingshoefer, Trautskirchen (DE); Jens Stuerzenhofecker, Markt Erlbach (DE)

(73) Assignee: Mekra Lang GmbH & Co. KG, Ergersheim (DE)

( * ) Notice: Subject to any disclaimer, the term of this patent is extended or adjusted under 35 U.S.C. 154(b) by 231 days.

(21) Appl. No.: 13/673,249

(22) Filed: Nov. 9, 2012

(65) Prior Publication Data

US 2013/0120938 A1 May 16, 2013

(30) Foreign Application Priority Data

Nov. 11, 2011 (DE) .......................... 10 2011 086 196

(51) Int. Cl.
*H05K 7/20* (2006.01)
*H04N 5/64* (2006.01)
(Continued)

(52) U.S. Cl.
CPC .............. *H05K 7/20963* (2013.01); *H05K 7/00* (2013.01); *G06F 1/1601* (2013.01); *H04N 5/64* (2013.01); *G02F 2001/133314* (2013.01); *G06F 1/20* (2013.01)

(58) Field of Classification Search
CPC ...................... H05K 7/20963; H05K 7/20954; H05K 7/00; G06F 1/20; G06F 1/1601; H04N 5/64

USPC ........ 361/679.46–679.54, 688–723; 362/373, 362/218, 264, 294; 174/16.1, 16.3, 526, 174/547–548; 165/80.2–80.3; 454/184; 312/236; 353/61; 313/33, 46, 582; 340/540; 348/143
See application file for complete search history.

(56) References Cited

U.S. PATENT DOCUMENTS 5,978,223 A * 11/1999 Hamilton et al. ............. 361/704
7,072,179 B1 * 7/2006 Curran et al. ............ 361/679.21
(Continued)

FOREIGN PATENT DOCUMENTS

EP    1933555    12/2006
JP    2004207801   12/2002
(Continued)

OTHER PUBLICATIONS

Office Action from the German Patent Office dated Sep. 14, 2012 in related German application DE102011086196.3 (6 pages).
(Continued)

*Primary Examiner* — Zachary M Pape
(74) *Attorney, Agent, or Firm* — Imperium Patent Works; Darien K. Wallace

(57) ABSTRACT

A monitor has a rear panel formed by injection molding plastic around a metal cooling element. The monitor includes a display panel, control electronics, a module support, and a monitor housing. The housing includes a front frame, the cooling element and a rear panel frame. The cooling element has cooling ducts formed between cooling fins. The rear housing panel frame has fin extensions that extend the fins of the cooling element into the rear housing panel frame. The display panel attaches to one side of the module support, while the control electronics attach to the other side. The front frame and the rear panel frame screw together, and the display panel and control electronics are clamped between the front frame and the rear panel frame. The monitor can be attached to a vehicle by slipping a retaining member into a T-shaped duct formed between two fins on the cooling element.

20 Claims, 6 Drawing Sheets

(51) Int. Cl.
*H05K 7/00* (2006.01)
*G06F 1/16* (2006.01)
*G02F 1/1333* (2006.01)
*G06F 1/20* (2006.01)

(56) References Cited

U.S. PATENT DOCUMENTS

| | | | |
|---|---|---|---|
| 7,254,014 B2* | 8/2007 | Cancellieri et al. | 361/679.27 |
| 7,440,276 B1 | 10/2008 | Chen | 361/690 |
| 8,035,968 B2* | 10/2011 | Kwon et al. | 361/695 |
| 2002/0080297 A1* | 6/2002 | Sung | 349/58 |
| 2002/0109969 A1* | 8/2002 | Wellhofer | 361/687 |
| 2003/0227581 A1 | 12/2003 | Sung et al. | 349/58 |
| 2004/0004680 A1* | 1/2004 | Kim | 349/58 |
| 2006/0018092 A1* | 1/2006 | Nagano | 361/687 |
| 2008/0297600 A1* | 12/2008 | Ito | 348/143 |
| 2008/0297998 A1 | 12/2008 | Choi | 361/681 |
| 2009/0121849 A1* | 5/2009 | Whittaker | 340/425.5 |
| 2009/0159416 A1* | 6/2009 | Tseng et al. | 200/341 |
| 2011/0134359 A1 | 6/2011 | An et al. | 349/61 |
| 2012/0236499 A1* | 9/2012 | Murayama et al. | 361/696 |
| 2013/0128519 A1* | 5/2013 | Kuo et al. | 362/97.1 |
| 2013/0162120 A1* | 6/2013 | Campagna et al. | 312/223.1 |
| 2013/0208428 A1* | 8/2013 | Hui et al. | 361/720 |
| 2015/0049243 A1* | 2/2015 | Samuels et al. | 348/374 |

FOREIGN PATENT DOCUMENTS

| | | |
|---|---|---|
| JP | 2004350151 | 5/2003 |
| JP | EP1619539 A1 | 7/2005 |

OTHER PUBLICATIONS

Search Report of the European Patent Office in foreign counterpart application EP12191977.3 dated Jan. 8, 2015 citing references A-I (10 pages).

\* cited by examiner

MODULAR MONITOR ENCLOSED IN A HOUSING WITH A NOVEL REAR PANEL

CROSS REFERENCE TO RELATED APPLICATION

This application is based on and hereby claims the benefit under 35 U.S.C. §119 from German Patent Application No. DE 102011086196.3, filed on Nov. 11, 2011, in the German Patent Office. This application is a continuation of German Patent Application No. DE 102011086196.3, the contents of which are incorporated herein by reference.

TECHNICAL FIELD

The present invention relates to a monitor for displaying images from the exterior of a vehicle and a cooling element integrated into the rear panel of the monitor.

BACKGROUND

Monitors are increasingly necessary in motor vehicles for displaying images from cameras and other optical information. Monitors of this type must be comparatively robust due to vibrations occurring in the motor vehicle and due to their placement also on the exterior of the vehicle, but at the same time may not be too expensive. Therefore, an object of the present invention is to specify a monitor adapted specifically for motor vehicles that is simple and cost effective in design and that requires as little maintenance as possible.

SUMMARY

A modular monitor has a novel rear panel formed by injection molding plastic around a metal cooling element. The monitor is used to display video and still images to the operator of a motor vehicle. The monitor includes a display panel, control electronics, a module support, and a monitor housing. The monitor housing includes a front housing frame, the cooling element and a rear housing panel frame. The cooling element has cooling ducts formed between cooling fins. The rear housing panel frame has fin extensions that extend the cooling fins of the cooling element into the rear housing panel frame. The display panel lockingly attaches to one side of the module support, while the control electronics lockingly attach to the other side of the module support. The functional component that includes the attached display panel, control electronics and module support lockingly attaches to the front housing frame. The front housing frame and the rear housing panel are screwed together, and the display panel and control electronics are clamped in place between the front housing frame and the rear housing panel frame. The monitor can be attached to a motor vehicle by slipping a retaining member into a T-shaped duct formed between two fins on the cooling element. Alternatively, the retaining member can be screwed to the cooling element.

The monitor is adapted particularly to motor vehicles. The design of the monitor is simple and cost effective and requires as little maintenance as possible. The monitor includes a functional component with a display panel and control electronics arranged in a monitor housing. The housing includes a front housing frame and a rear housing wall or panel. Because of the form-locking engagement of the display panel and the control electronics with the module support on the one hand and the form-locking engagement of the module support (including the display panel and control electronics) with the front housing frame on the other, the functional component (including the display panel and control electronics) is held in place along two dimensions in a simple manner. The functional component (including the module support with the display panel and control electronics) is clamped in place between the front housing frame and the rear housing wall or panel. The front housing frame and the rear housing panel are screwed together, thereby fixing the functional component (including the display panel and control electronics) in place along the third dimension. The components inside the monitor housing are thus fixed solely via positive engagement by being press-fitted or clamped in position. Hence, the number of screw connections that can loosen as a result of vibrations is minimized. At the same time this simplifies the assembly of the monitor because the components are merely interlocked, and only the two parts of the monitor housing, namely the front housing frame and the rear housing wall or panel, are screwed together. A cooling element is preferably integrated into the rear housing panel.

The rear housing panel with its integrated cooling element is generally suited to monitors and not just to monitors used in vehicles. By integrating the cooling element into the rear housing panel, waste heat is efficiently dispersed from inside the monitor housing in a simple manner. In addition, the housing of the monitor also provides a covering that is impermeable to water spray.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
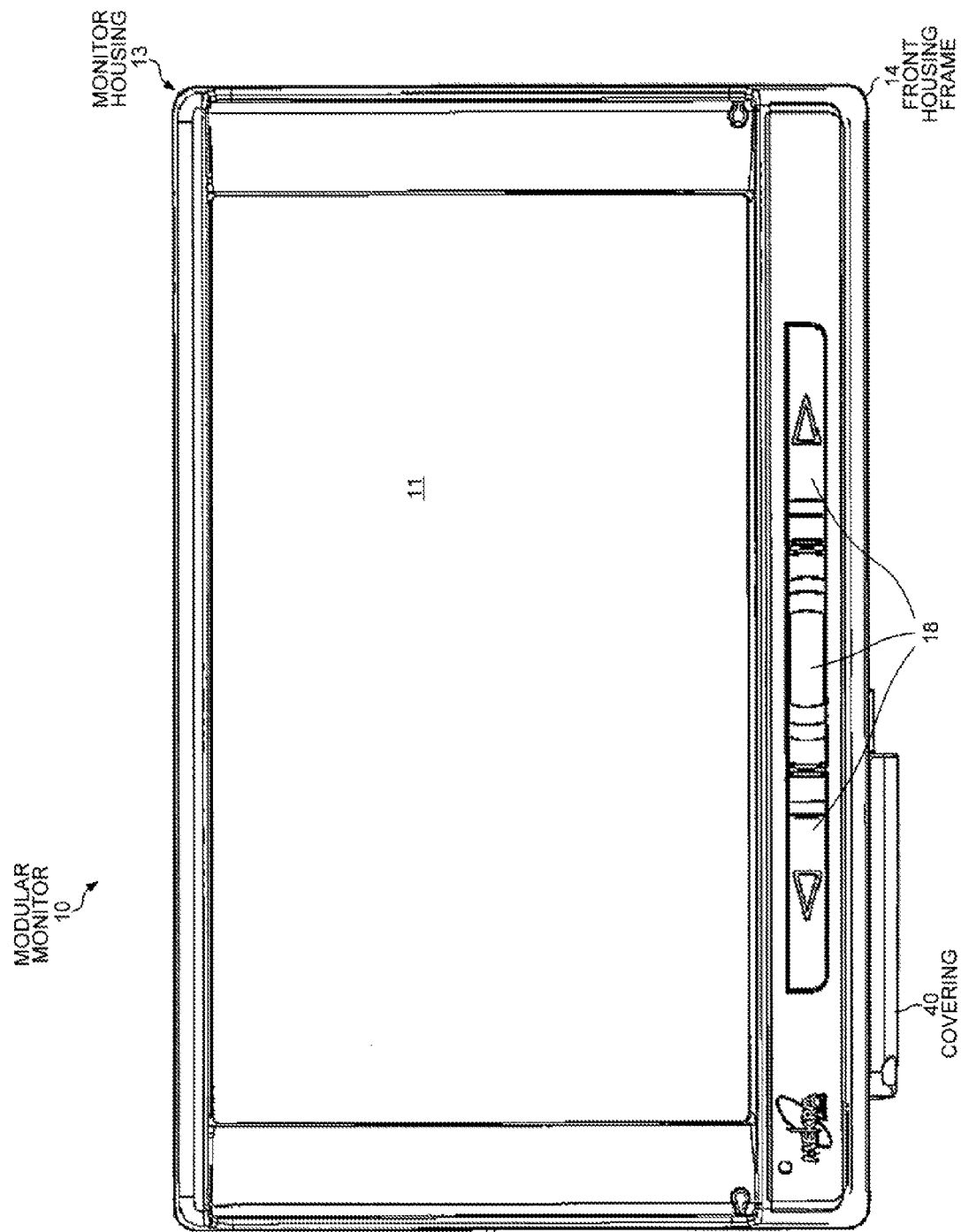
FIG. 1 is a front view of an exemplary embodiment of a monitor.

Reference will now be made in detail to some embodiments of the invention, examples of which are illustrated in the accompanying drawings.

Because of the form-locking engagement of the display panel and control electronics with the module support on the one hand and the form-locking engagement of the module support (including the display panel and control electronics) with the front housing frame on the other, the functional component that includes the display panel and control electronics is fixed in place along two dimensions in a simple manner inside the monitor. The functional component (including the module support with the display panel and control electronics) is clamped in place between the front housing frame and the rear housing panel. The front housing frame and the rear housing panel are screwed together such that the functional component that includes the display panel and control electronics is fixed in place along a third dimension. The components inside the monitor housing are thus fixed solely through positive engagement by being press-fitted or clamped in position. Hence, the number of screw connections that can loosen as a result of vibration is minimized. The form-locking engagement also simplifies the assembly of the monitor because the monitor's are merely interlocked, and only the two parts of the monitor housing (the front housing frame and the rear housing panel) are screwed together.

Embodiments of the monitor include a maintenance-friendly design and a design that can be operated in a conventional manner. The control electronics are protected from environmental influences and, in particular, spray and moisture. The housing is impermeable to water spray. In addition, a deformable peripheral seal compensates for production tolerances. The front housing frame presses against the control panel, and the rear housing panel presses against the functional component such that the display panel and control electronics are securely clamped in the module support.

Waste heat from the functional component is diverted outwardly. Heat is easily dissipated from the interior of the housing. Thermal contact is established between the functional component and the cooling element as the functional component is securely clamped in the monitor housing. A heat-conducting deformable seal dissipates heat to the outside of the monitor and also compensates for unavoidable production tolerances of the individual monitor components.

The rear wall or panel of the monitor has cooling fins. Exposed sharp edges of the cooling fins are avoided, and heat build-up at the ends of the cooling fins is prevented by the extended cooling ducts. Because the cooling element is normally made of metal, and the rest of the monitor housing (including the rear housing panel frame and the front housing frame) is made of plastic, it is advantageous to locate the fastening means, such as screw holes or longitudinal grooves, in the stable metal cooling element. By integrating the cooling element into the rear housing panel, waste heat is efficiently dispersed from the interior of the monitor housing. The monitor housing is also rendered impermeable to water spray. The rear housing panel is suited to monitors generally and not just to monitors used in vehicles.

FIG. 1 is a front view of a modular monitor 10. The modularly designed monitor 10 includes a functional component comprising an integrated display panel 11 and the associated control electronics 12. The display panel 11 is a liquid crystal display. A protective screen (not shown) is provided over the field of view of the display. The functional component (including display panel 11 and control electronics 12) is arranged in a monitor housing 13. Monitor housing 13 includes a front housing frame 14 and a rear housing wall or panel 15. The functional component of monitor 10 is formed by inserting display panel 11 into a module support 16 such that panel 11 snaps or locks into support 16 from the front side. Thus, display panel 11 is fixed in place along two dimensions. Similarly, the functional component is also formed by inserting control electronics 12 into module support 16 such that control electronics 12 snap or lock into support 16 from the back side. So control electronics 12 are also fixed in place along the two dimensions.

Control electronics 12 and display panel 11 are electrically connected by means of electrical contacts and leads through module support 16 and around the outside of display panel 11 and control electronics 12. The functional component formed by form-lockingly fitting display panel 11 and control electronics 12 into module support 16 is itself form-lockingly inserted into front housing frame 14. Thus, all of the parts of the functional component are fixed in place along two dimensions in monitor 10. A peripheral seal 17 is arranged in monitor housing 13 between front housing frame 14 and display panel 11. Peripheral seal 17 renders monitor housing 13 impermeable to water spray.

Figure 2:
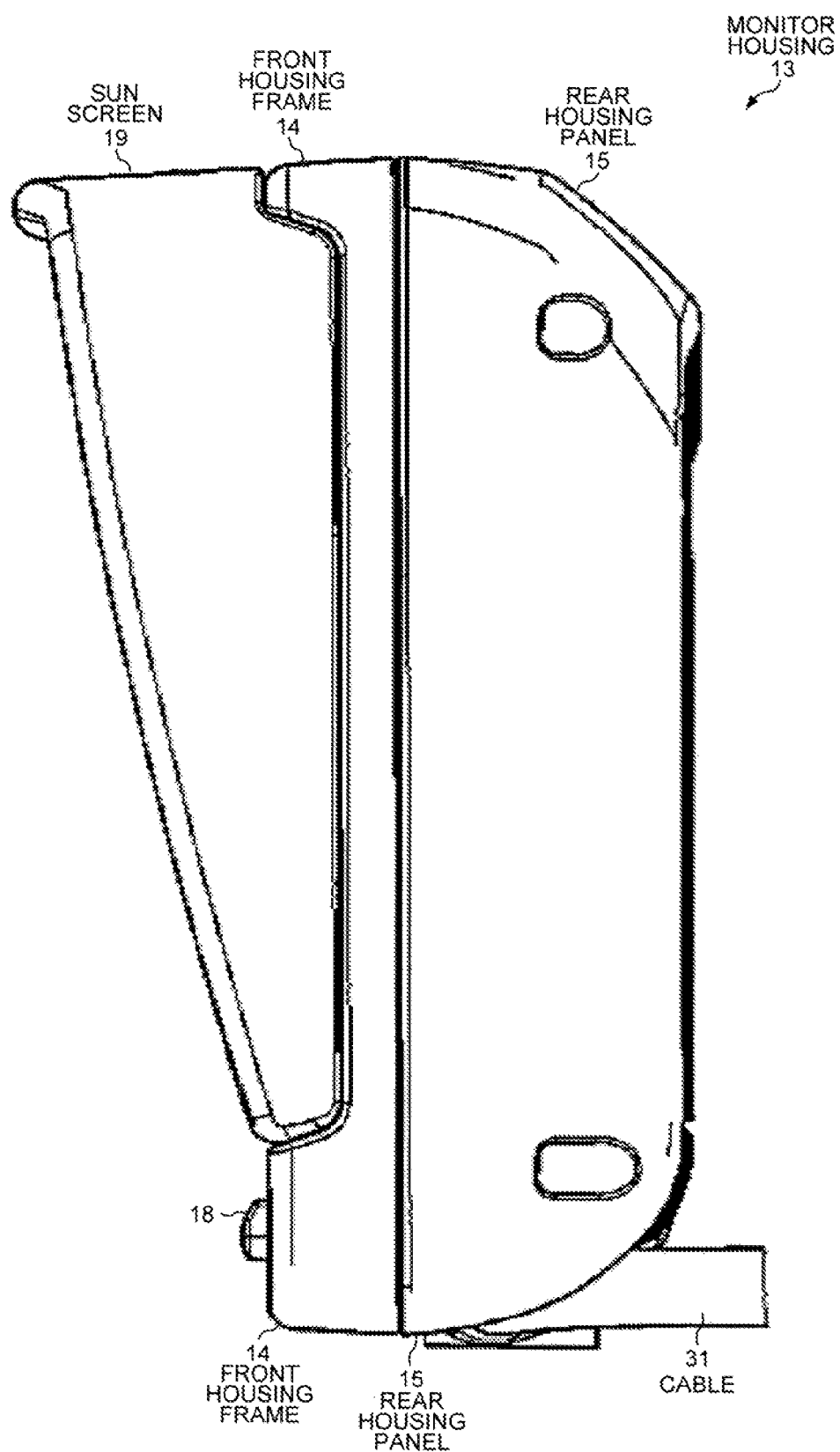
FIG. 2 is a side view of the monitor of FIG. 1 from the direction of the arrow R in FIG. 1.

Control elements 18 are integrated into the front side of front housing frame 14. Control elements 18 are inserted from the front side into and attached to front housing frame 14. Control elements 18 are glued into front housing frame 14 by means of an adhesive layer on the back side of the control elements. Display panel 11 and control electronics 12 are electrically connected by electrical contacts and contact surfaces. FIG. 2 shows a sun screen 19 is mounted on the front side of front housing frame 14 in order to improve the visibility of monitor 10 when in direct sunlight.

Figure 3:
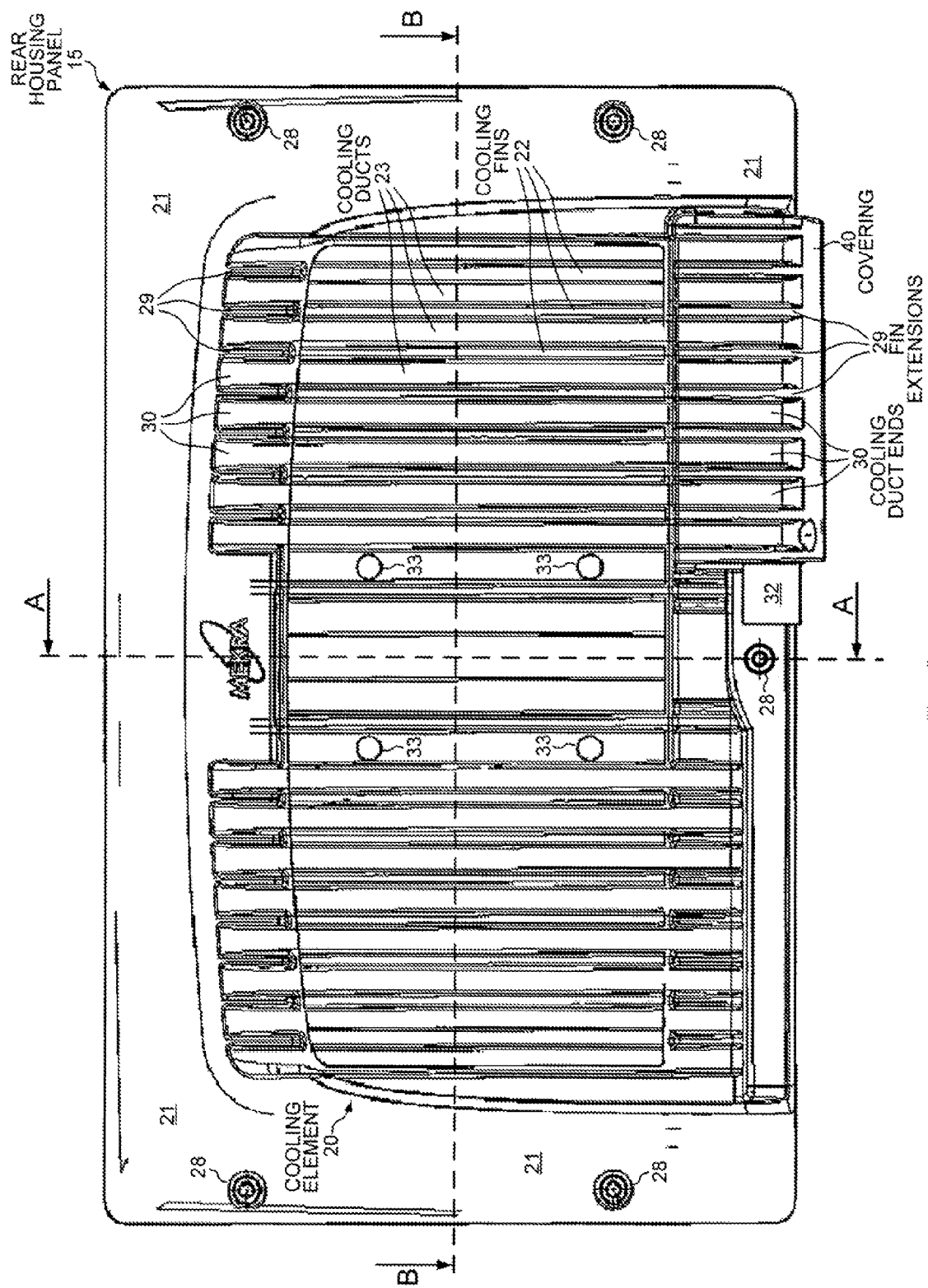
FIG. 3 is a rear view of the monitor of FIG. 1.

FIG. 3 shows that a cooling element 20 is integrated into rear housing panel 15 such that rear housing panel 15 includes cooling element 20 and a rear housing panel frame 21. In one embodiment, rear housing panel frame 21 is plastic and is formed using injection molding around cooling element 20. Thus, the interface between cooling element 20 and rear housing panel 15 is impermeable to water spray. Cooling fins 22 with cooling ducts 23 formed between them are integrated into the outside of cooling element 20 of rear housing panel 15.

Figure 4:
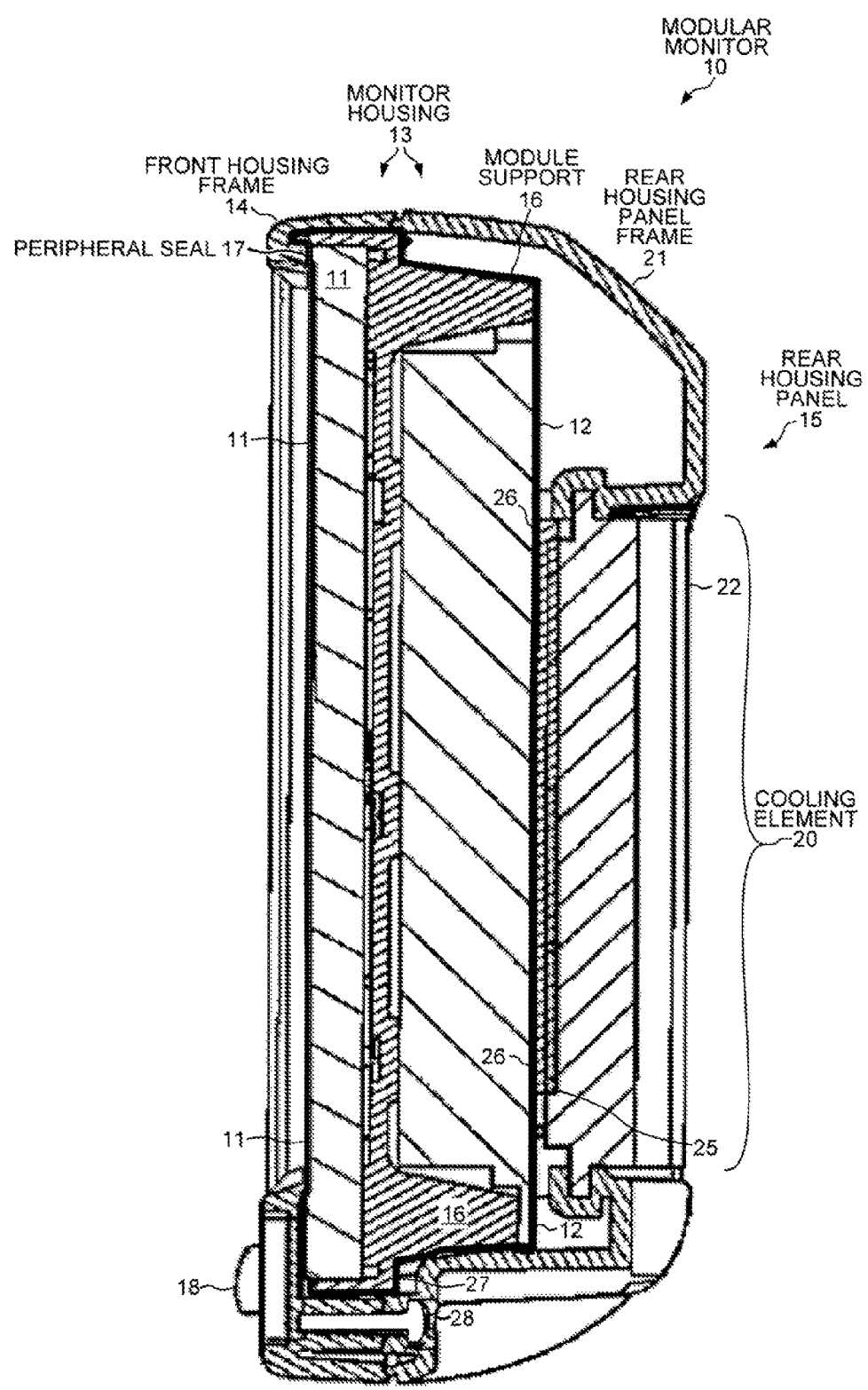
FIG. 4 is a cross-sectional view of the monitor along the line A-A in FIG. 3.
Figure 5:
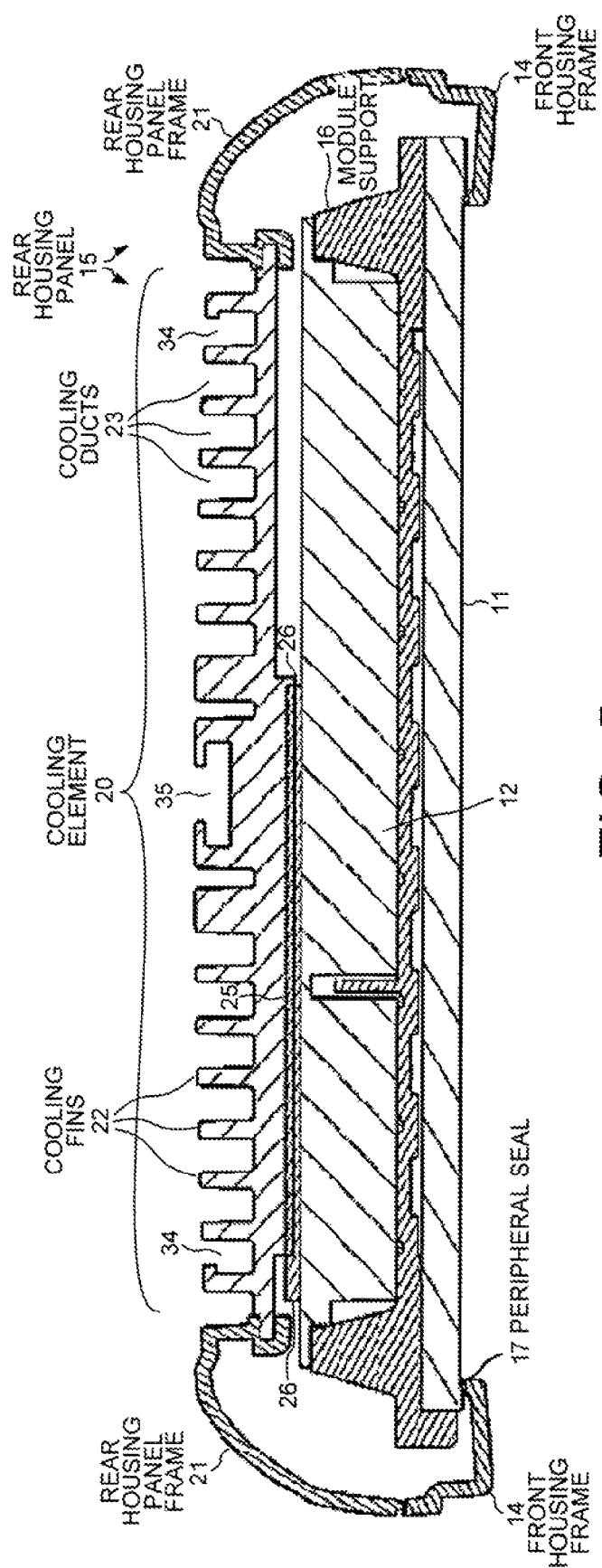
FIG. 5 is a cross-sectional view of the monitor along the line B-B in FIG. 3.

FIG. 4 is a cross-sectional view of monitor 10 along the line A-A shown in FIG. 3. FIG. 4 shows that a thermal contact surface 25 is formed on the inside of cooling element 20. Thermal contact surface 25 is in heat conducting contact with control electronics 12. A deformable heat conducting layer 26 is disposed between thermal contact surface 25 and control electronics 12. Layer 26 improves the transfer of heat between the heat-emitting control electronics 12 and the heat-absorbing cooling element 20. FIG. 5 shows that thermal contact surface 25 and heat conducting layer 26 extend over only a portion of the surface of the control electronics 12. FIG. 5 also shows functional component 27 that is formed by display panel 11 and control electronics 12 locking into module support 16.

FIG. 5 is a cross-sectional view of monitor 10 along the line B-B shown in FIG. 3. As shown in FIGS. 4-5, display panel 11 is pressed against front housing frame 14 the peripheral seal 17 in between the two. Control electronics 12 are pressed against thermal contact surface 25 with heat conducting layer 26 in between the two. Thus, control electronics 12 are supported by thermal contact surface 25 of cooling element 20 of rear housing panel 15. In this way, functional component 27 comprising control electronics 12, support module 16 and display panel 11, is clamped in place between front housing frame 14 and rear housing panel 15. Functional component 27 is fixed in place along the third dimension relative to the monitor housing 13. Rear housing panel 15 is screwed to front housing frame 14 with five screws 28, as shown in FIG. 3, rendering monitor housing 13 impermeable to water spray.

Figure 6:
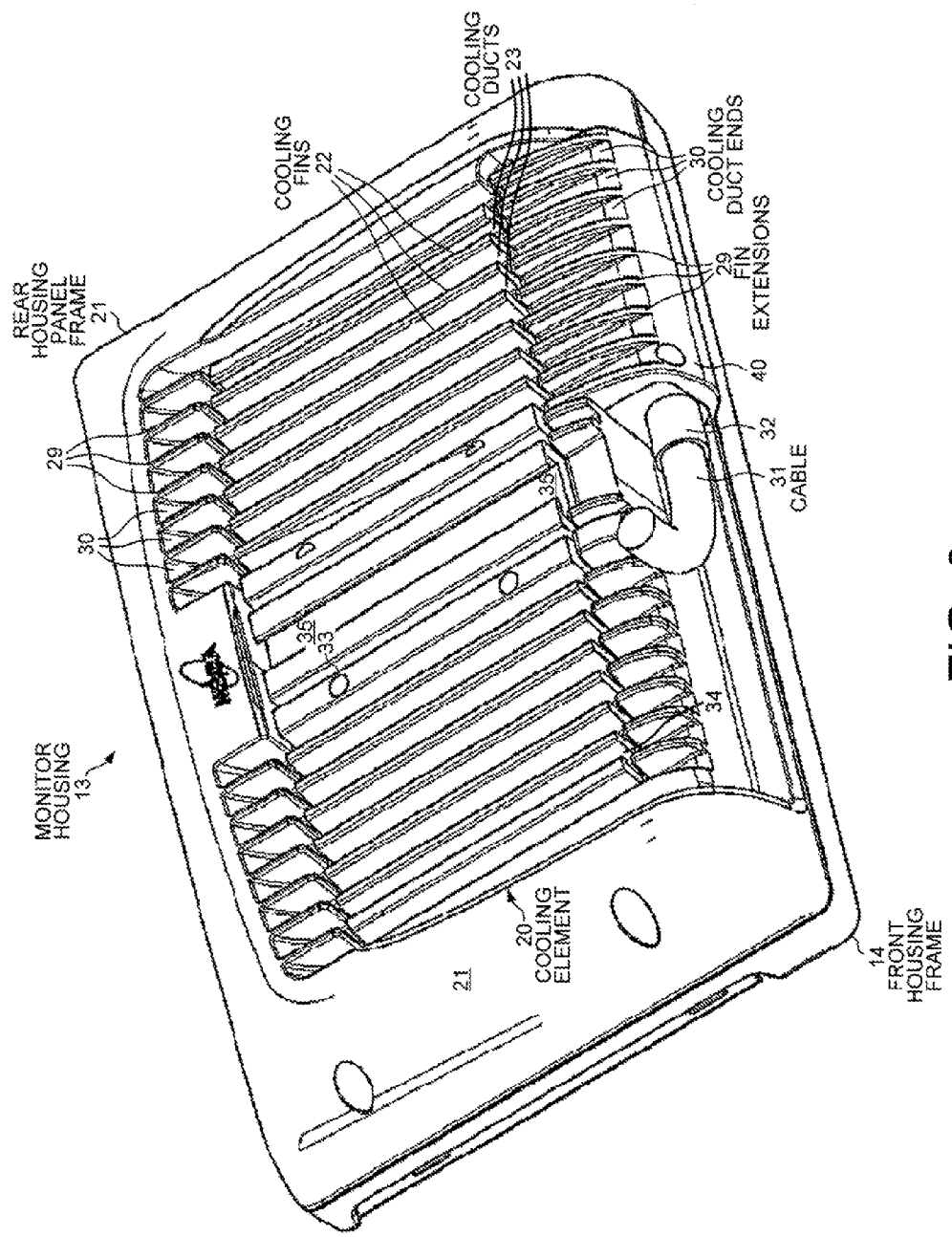
FIG. 6 is a perspective view of the monitor of FIG. 1.

FIG. 6 shows that, in operation, the cooling fins 22 and the cooling ducts 23 on the outer surface of rear housing panel 15 extend vertically, which promotes the convection and dissipation of waste heat. The cooling fins 22 and cooling ducts 23 extend at the top and bottom of rear housing panel frame 21 into fin extensions 29 and cooling duct ends 30. Because the fin extensions 29 are the same height as the cooling fins 22, the extensions 29 cover the sharp ends of the cooling fins 22 and thereby reduce the risk of injury from cuts and snags. The cooling ducts 23 extend upwardly and downwardly into the cooling duct ends 30 and thereby allow the heated air in the extended cooling ducts 30 to escape more easily. This prevents the accumulation of heat particularly in the upper portion of rear housing panel frame 21 and at the upper end of the cooling fins 22. The ends of the cooling duct ends 30 in the upper portion of rear housing panel frame 21 are curved and rounded so that the heated air is guided away from monitor housing 13.

Video signals and power are supplied to monitor 10 through a cable 31. Cable 31 exits monitor housing 13 through a cable bushing 32 in the lower portion of rear housing panel frame 21. Cable bushing 32 is sealed by a covering 40 that prevents water spray from entering monitor housing 13 around cable 31.

Monitor 10 can be mounted at an operational location, for example, to the exterior of a motor vehicle, at screw holes 33 on the outside of cooling element 20. Alternatively, monitor 10 can be attached to the motor vehicle by sliding a retaining member up into modified cooling ducts 34 that have L-shaped cross sections. Modified cooling ducts 34 are located at the outer left and right sides of cooling element 20, as shown in FIG. 5.

Or monitor 10 can be attached to the motor vehicle by sliding a retaining member up into a modified cooling duct 35 at the center of cooling element 20 that has a T-shaped cross section. The retaining member that are slip into cooling ducts 34 or 35 have the corresponding L-shaped or T-shaped cross-sections.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A monitor comprising:
   a display panel;
   control electronics;
   a module support, wherein the display panel lockingly attaches to a front side of the module support, and wherein the control electronics lockingly attach to a back side of the module support; and
   a monitor housing including a front housing frame and a rear housing panel, wherein the display panel, the control electronics and the module support lockingly attach to the front housing frame, wherein the front housing frame and the rear housing panel are screwed together, wherein the display panel and the control electronics are clamped in place between the front housing frame and the rear housing panel, wherein the rear housing panel includes a plastic rear housing panel frame and a metal cooling element, wherein the cooling element is integrated into the rear housing panel frame, and wherein the rear housing panel frame is formed by injection molding plastic around the cooling element.

2. The monitor of claim 1, further comprising:
   control elements that are integrated into the front housing frame, wherein the control elements are accessible from outside the monitor.

3. The monitor of claim 2, wherein the control elements are attached to the front housing frame by being inserted from the front side of the front housing frame.

4. The monitor of claim 3, wherein the control elements are glued to the front housing frame using an adhesive layer on the back side of the control elements.

5. The monitor of claim 1, further comprising:
   a peripheral seal disposed between the display panel and the front housing frame.

6. The monitor of claim 1, wherein the monitor housing is impermeable to water spray.

7. The monitor of claim 1, wherein the rear housing panel frame is molded around the cooling element such that water cannot penetrate between the rear housing panel and the cooling element.

8. The monitor of claim 1, wherein the cooling element includes cooling fins and a thermal contact surface, and wherein the thermal contact surface absorbs heat emitted from the control electronics.

9. The monitor of claim 8, wherein a deformable heat conducting layer is attached to the control electronics, and wherein the deformable heat conducting layer is sandwiched between the control electronics and the thermal contact surface of the cooling element.

10. The monitor of claim 1, wherein the cooling element includes a means for mounting the monitor.

11. The monitor of claim 10, wherein the means for mounting the monitor includes screw holes.

12. A monitor comprising:
    a display panel;
    control electronics;
    a module support, wherein the display panel lockingly attaches to a front side of the module support, and wherein the control electronics lockingly attach to a back side of the module support; and
    a monitor housing including a front housing frame and a rear housing panel, wherein the display panel, the control electronics and the module support lockingly attach to the front housing frame, wherein the front housing frame and the rear housing panel are screwed together, wherein the display panel and the control electronics are clamped in place between the front housing frame and the rear housing panel, wherein the rear housing panel includes a rear housing panel frame and a cooling element, wherein the cooling element is integrated into the rear housing panel frame, wherein the cooling element includes cooling fins, wherein cooling ducts are formed between the cooling fins, wherein the rear housing panel frame includes fin extensions and cooling duct ends, wherein the fin extensions extend the cooling fins into the rear housing panel frame, and wherein cooling duct ends extend the cooling ducts into the rear housing panel frame.

13. A monitor comprising:
    a display panel;
    control electronics;
    a module support, wherein the display panel lockingly attaches to a front side of the module support, and wherein the control electronics lockingly attach to a back side of the module support; and
    a monitor housing including a front housing frame and a rear housing panel, wherein the display panel, the control electronics and the module support lockingly attach to the front housing frame, wherein the front housing frame and the rear housing panel are screwed together, wherein the display panel and the control electronics are clamped in place between the front housing frame and the rear housing panel, wherein the rear housing panel includes a rear housing panel frame and a cooling element, wherein the cooling element is integrated into the rear housing panel frame, wherein the cooling element includes a means for mounting the monitor, and wherein the means for mounting the monitor includes two cooling ducts, each of which having an L-shaped cross section.

14. A monitor comprising:
    a display panel;
    control electronics;
    a module support, wherein the display panel lockingly attaches to a front side of the module support, and wherein the control electronics lockingly attach to a back side of the module support; and a monitor housing including a front housing frame and a rear housing panel, wherein the display panel, the control electronics and the module support lockingly attach to the front housing frame, wherein the front housing frame and the rear housing panel are screwed together, wherein the display panel and the control electronics are clamped in place between the front housing frame and the rear housing panel, wherein the rear housing panel includes a rear housing panel frame and a cooling element, wherein the cooling element is integrated into the rear housing panel frame, wherein the cooling element includes a means for mounting the monitor, and wherein the means for mounting the monitor includes a cooling duct that has a T-shaped cross section.

15. A monitor comprising:
a display panel;
control electronics;
a front housing frame, wherein the display panel and the control electronics are lockingly attached to the front housing frame; and
a rear housing panel that includes a rear housing panel frame and a cooling element, wherein the front housing frame and the rear housing panel are screwed together, wherein the display panel and the control electronics are clamped in place between the front housing frame and the rear housing panel, wherein the cooling element is integrated into the rear housing panel frame, wherein the rear housing panel frame is made of plastic, and the cooling element is made of metal, and wherein the rear housing panel frame is formed by injection molding plastic around the cooling element.

16. The monitor of claim 15, wherein the cooling element includes cooling fins and a thermal contact surface, and wherein the thermal contact surface absorbs heat emitted by the control electronics.

17. The monitor of claim 16, wherein a deformable heat conducting layer is attached to the control electronics, and wherein the deformable heat conducting layer is sandwiched between the control electronics and the thermal contact surface of the cooling element.

18. The monitor of claim 15, wherein the cooling element includes a means for attaching the monitor to a motor vehicle.

19. The monitor of claim 15, wherein the cooling element includes two cooling fins that form a cooling duct with a T-shaped cross section.

20. A monitor comprising:
a display panel;
control electronics;
a front housing frame, wherein the display panel and the control electronics are lockingly attached to the front housing frame; and
a rear housing panel that includes a rear housing panel frame and a cooling element, wherein the front housing frame and the rear housing panel are screwed together, wherein the display panel and the control electronics are clamped in place between the front housing frame and the rear housing panel, wherein the cooling element is integrated into the rear housing panel frame, wherein the cooling element includes cooling fins, wherein cooling ducts are formed between the cooling fins, wherein the rear housing panel frame includes fin extensions and cooling duct ends, wherein the fin extensions extend the cooling fins into the rear housing panel frame, and wherein the cooling duct ends extend the cooling ducts into the rear housing panel frame.

* * * * *